United States Patent [19]

Haneda

[11] Patent Number: 4,794,063

[45] Date of Patent: Dec. 27, 1988

[54] PHOTORECEPTOR FOR ELECTROPHOGRAPHY, METHOD FOR THE PRODUCTION THEREOF AND METHOD OF THE IMAGE FORMATION THEREBY

[75] Inventor: Satoshi Haneda, Hachioji, Japan

[73] Assignee: Konishiroku Photo Industry Co., Ltd., Tokyo, Japan

[21] Appl. No.: 921,600

[22] Filed: Oct. 20, 1986

[30] Foreign Application Priority Data

| | | | |
|---|---|---|---|
| Oct. 23, 1985 | [JP] | Japan | 60-238489 |
| Nov. 8, 1985 | [JP] | Japan | 60-251483 |
| Nov. 8, 1985 | [JP] | Japan | 60-251484 |

[51] Int. Cl.$^4$ .......... G03G 5/12; G03F 9/00

[52] U.S. Cl. .......... 430/42; 430/45; 430/46

[58] Field of Search .......... 430/7, 42, 45, 46

[56] References Cited

U.S. PATENT DOCUMENTS

| | | | |
|---|---|---|---|
| 3,836,363 | 9/1974 | Plutchak | 430/46 |
| 3,915,703 | 10/1975 | Mori et al. | 430/46 |
| 4,307,165 | 12/1981 | Blazey et al. | 430/46 |
| 4,565,756 | 1/1986 | Needs et al. | 430/7 |

*Primary Examiner*—John L. Goodrow
*Attorney, Agent, or Firm*—Frishauf, Holtz, Goodman & Woodward

[57] ABSTRACT

The present invention provides a photoreceptor for electrophotography use comprising a photosensitive layer having thereon layers comprising a group of a plurality of different color separation filters containing coloring agents and a preferably not less than 70% by weight transparent resin, the said group of a plurality of filters being in the form of a complex filter layer whose specific resistance is preferably not less than $10^9\Omega$cm and more preferably not less than $10^{13}\Omega$cm, and a method of the production of the photoreceptor in which the above complex filter is formed on the photosensitive layer by a printing process.

28 Claims, 14 Drawing Sheets

FIG. 4

| ORIGINAL CALOR | WHITE | | | RED | | | GREEN | | | BLUE | | | YELLOW | | | MAGENTA | | | CYAN | | | BLACK | | |
|---|---|---|---|---|---|---|---|---|---|---|---|---|---|---|---|---|---|---|---|---|---|---|---|---|
| FILTER * | R | G | B | R | G | B | R | G | B | R | G | B | R | G | B | R | G | B | R | G | B | R | G | B |
| IMAGEWISE EXPOSURE | | | | | ◌ | ◌ | ◌ | | ◌ | ◌ | ◌ | | | | ◌ | | ◌ | | ◌ | | | ◌ | ◌ | ◌ |
| BLUE LIGHT OVERALL EXPOSURE | | | | | → | ○ | → | | ○ | → | → | | | | ○ | | → | | → | | | → | → | ○ |
| DEVELOPMENT BY YELLOW TONER | | | | | → | ◍ | → | | ◍ | → | → | | | | ◍ | | → | | → | | | → | → | ◍ |
| GREEN LIGHT OVERALL EXPOSURE | | | | | ○ | | → | | | → | ○ | | | | | | ○ | | → | | | → | ○ | |
| DEVELOPMENT BY MAGENTA TONER | | | | | ◍ | | → | | | → | ◍ | | | | | | ◍ | | → | | | → | ◍ | |
| RED LIGHT OVERALL EXPOSURE | | | | | | | ○ | | | ○ | | | | | | | | | ○ | | | ○ | | |
| DEVELOPMENT BY CYAN TONER | | | | | | | ◍ | | | ◍ | | | | | | | | | ◍ | | | ◍ | | |
| ADHERED TONER ** | — | — | — | — | M | Y | C | — | Y | C | M | — | — | — | Y | — | M | — | C | — | — | C | M | Y |
| REPRODUCED COLOR | WHITE | | | RED | | | GREEN | | | BLUE | | | YELLOW | | | MAGENTA | | | CYAN | | | BLACK | | |

* FILTER PROVIDED ON PHOTORECEPTOR

** Y, M AND C INDICATE THE PRESENCE OF YELLOW, MAGENTA AND CYAN TONER, RESPECTIVELY

FIG. 6
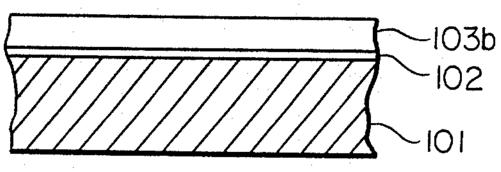
FIG. 7
7-A
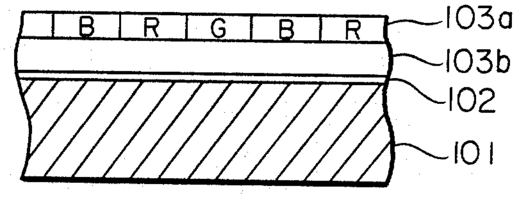
7-B
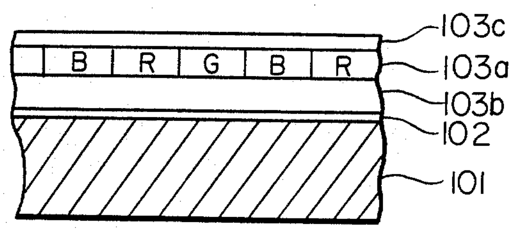

PHOTORECEPTOR FOR ELECTROPHOGRAPHY, METHOD FOR THE PRODUCTION THEREOF AND METHOD OF THE IMAGE FORMATION THEREBY

BACKGROUND OF THE INVENTION

The present invention relates to a photoreceptor for use in the formation of an electrophotographic multicolor image, a method for the production of the photoreceptor and a method for the image formation by use of the photoreceptor. The photoreceptor is to be used in various multicolor image forming apparatuses, color photograph printers, and the like.

There have until now been proposed several methods and apparatuses for the electrophotographic multicolor image formation, which include, for example, a method for the multicolor image formation wherein image transfer to a recording sheet of paper is repeatedly made each time when an appropriate color toner image is formed on a photoreceptor by subjecting the photoreceptor to an imagewise exposure and development corresponding to each individual separated color light, and an apparatus for the method (former), and which also include, for example, other method and apparatus therefore wherein a plurality of photoreceptors corresponding to the required number of separation colors are provided and each is separately subjected to an appropriate color imagewise exposure and development to thereby form different color toner images, which are then superposedly transferred in succession onto a sheet of recording paper (latter).

However, the former is disadvantageous in respect that a number of revolutions of the photoreceptor are needed to form a full color toner image, so that it takes time for image recording and it is thus difficult to speed up the image recording process. The latter, although advantageous in respect of rapidity because of the use of a plurality of photoreceptors in parallel, also has the disadvantage that the plurality of the photoreceptors causes the apparatus for use therewith to be of a large size and thus to be much expensive. Further, both former and latter have the problem that the image transfer is repeated a number of times, so that it is difficult to make accurate the register of a produced multicolor image.

SUMMARY OF THE INVENTION

The present invention has been made noticing the above problems and provides a photoreceptor for electrophotography use comprising a photosensitive layer having thereon layers comprising a group of a plurality of different color separation filters containing coloring agents and a preferably not less than 70% by weight transparent resin, the said group of a plurality of filters being in the form of a complex filter layer whose specific resistance is preferably not less than $10^9$ Ωcm and more preferably not less than $10^{13}$ Ωcm, and a method of the production of the photoreceptor in which the above complex filter is formed on the photosensitive layer by a printing process.

According to the photoreceptor of the above construction, the complex filter, because of its excellent physical characteristics, is excellent in its wear resistance as well as in the adhesion of its surface to be printed and besides is free from the adverse effect by the coloring agent of a printing ink upon the photoconductivity of the photosensitive layer. And in the filter, because the coloring agent is adequately protected by a binder resin, there occurs no interfilter color diffusion, so that the different color filter elements can be finely arrayed in rows or streak or in a mosaic form or pattern. Accordingly, on the photoreceptor a multicolor image excellent in the resolution can be formed.

The present invention also provides a method for the formation of an image which comprises a process for imagewise exposing the photoreceptor having a high-resistance complex filter comprised of a filter group of a plurality of filters different in color formed by inks containing coloring agents and a setting transparent resin and a process for repeating the cycle of uniformly exposing the photoreceptor to a specific light to form a potential pattern on the filter section corresponding to the specific light and developing the potential pattern with a toner.

According to this image forming method, a multicolor image excellent in the color balance and free of doubling can be formed easily and rapidly by only a single imagewise exposure.

In the present invention, a photoreceptor is used which has a complex filter comprised in combination of a plurality of filters arrayed in rows or a mosaic pattern provided with adequate physical characteristics by using a binder resin in a desired amount on a photosensitive layer having a sensitivity to at least the whole spectral region of visible light. The formation of a multicolor image by use of the photoreceptor is made, for example, in the following procedure: The entire area of the photoreceptor is first subjected to primary charging, secondary charging and simultaneous imagewise exposure to thereby form a primary latent image corresponding to the color-separated image densities on the photosensitive layer underneath the respective filters.

Subsequently, an overall exposure by a specific light— in this instance a light in the same color as that of the first color separation filter—is made, whereby on the photosensitive layer's portions underneath the filter of this color alone is formed a pattern of a surface potential corresponding to the strength of the above primary latent image; i.e., a secondary latent image having potential pattern. The secondary latent image is then developed by a toner having complementary-color relation with the above-mentioned filter. After that, recharging for smoothing the surface potential, overall exposure to a specific light to form a potential pattern in the subsequent color separation filter section, and a process for development by a toner having complementary-color relation with this filter are repeated to thereby form a multicolor image on the photoreceptor. This multicolor image is transferred with its different colors superposed onto a recording paper by only a single transfer operation.

BRIEF DESCRIPTION OF THE DRAWINGS

FIG. 4 is a diagrammatic table illustrating the image forming process from various color originals.

FIG. 6 is a cross-sectional view of the support of this invention.

FIGS. 7 A and B are cross-sectional views of multilayer products having a complex filter.

DETAILED DESCRIPTION OF THE INVENTION

Figure 1:
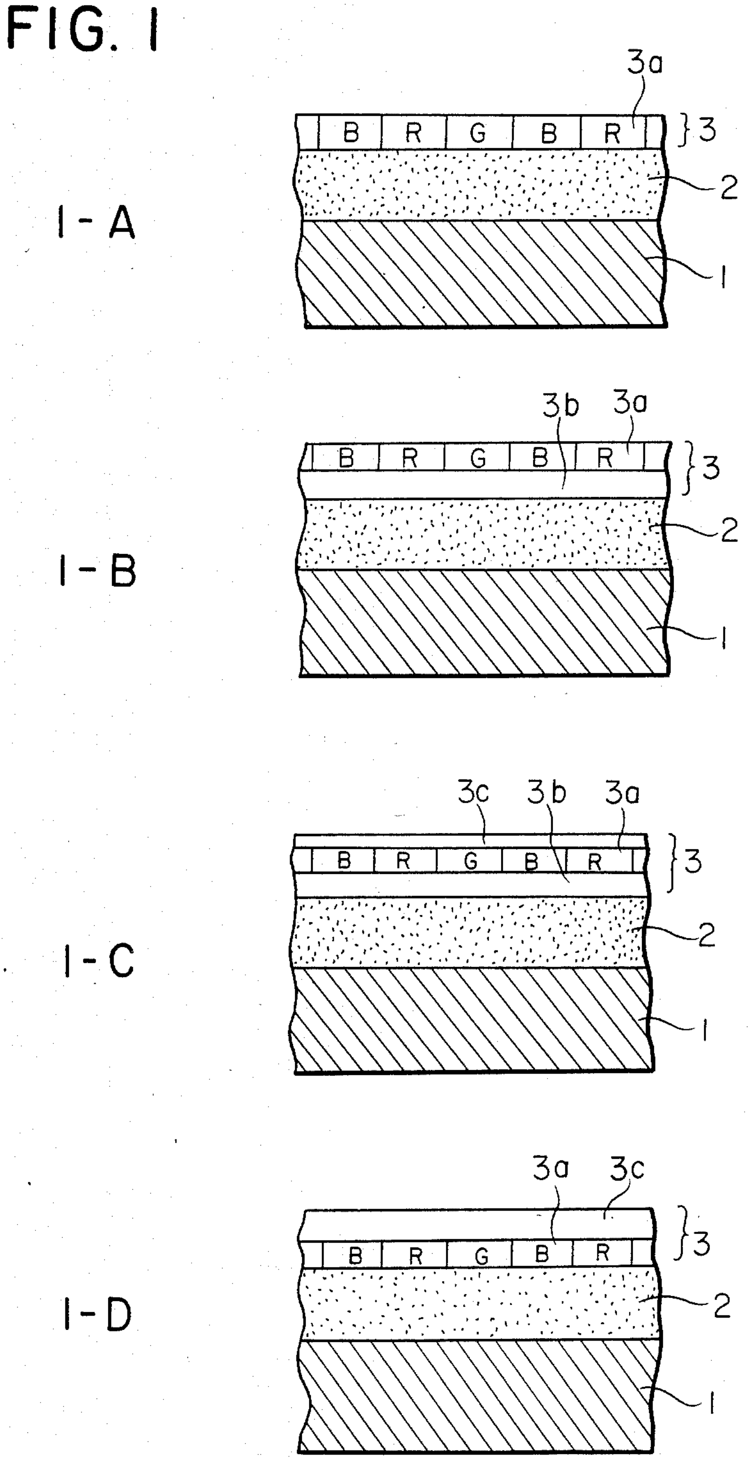
FIGS. 1A through D are cross-sectional views of examples of the photoreceptor of this invention.
Figure 2:
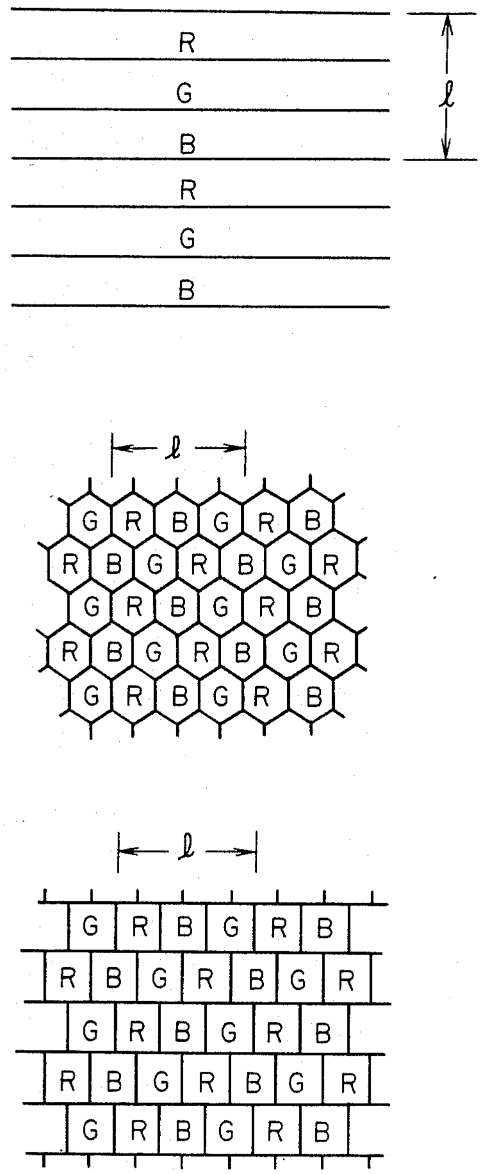
FIGS. 2A through C are drawings showing arrays of the respective color separation filter elements constituting the complex filter.
Figure 3:
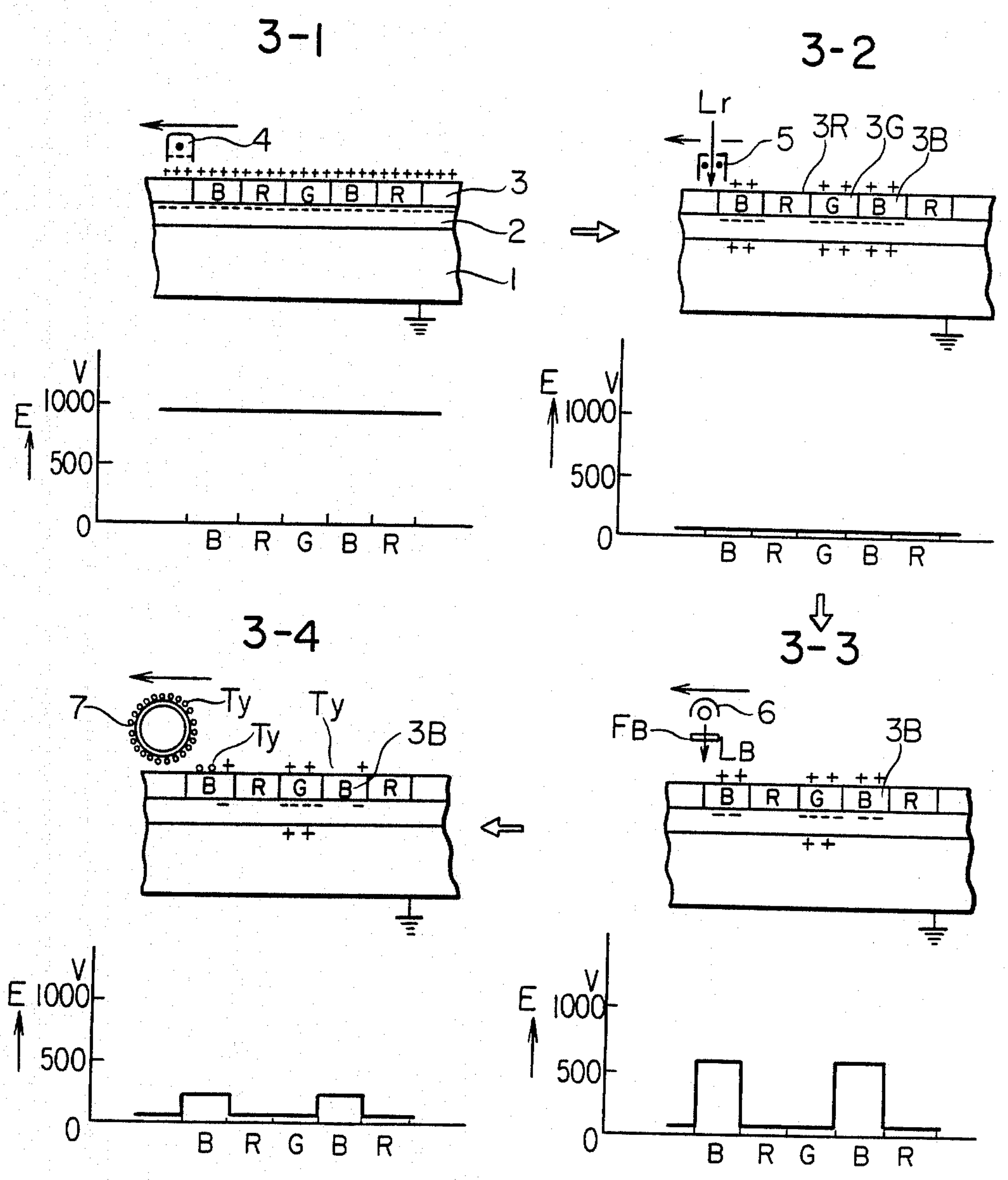
FIG. 3 is an explanatory drawing for the image forming process from various color originals.
Figure 3:
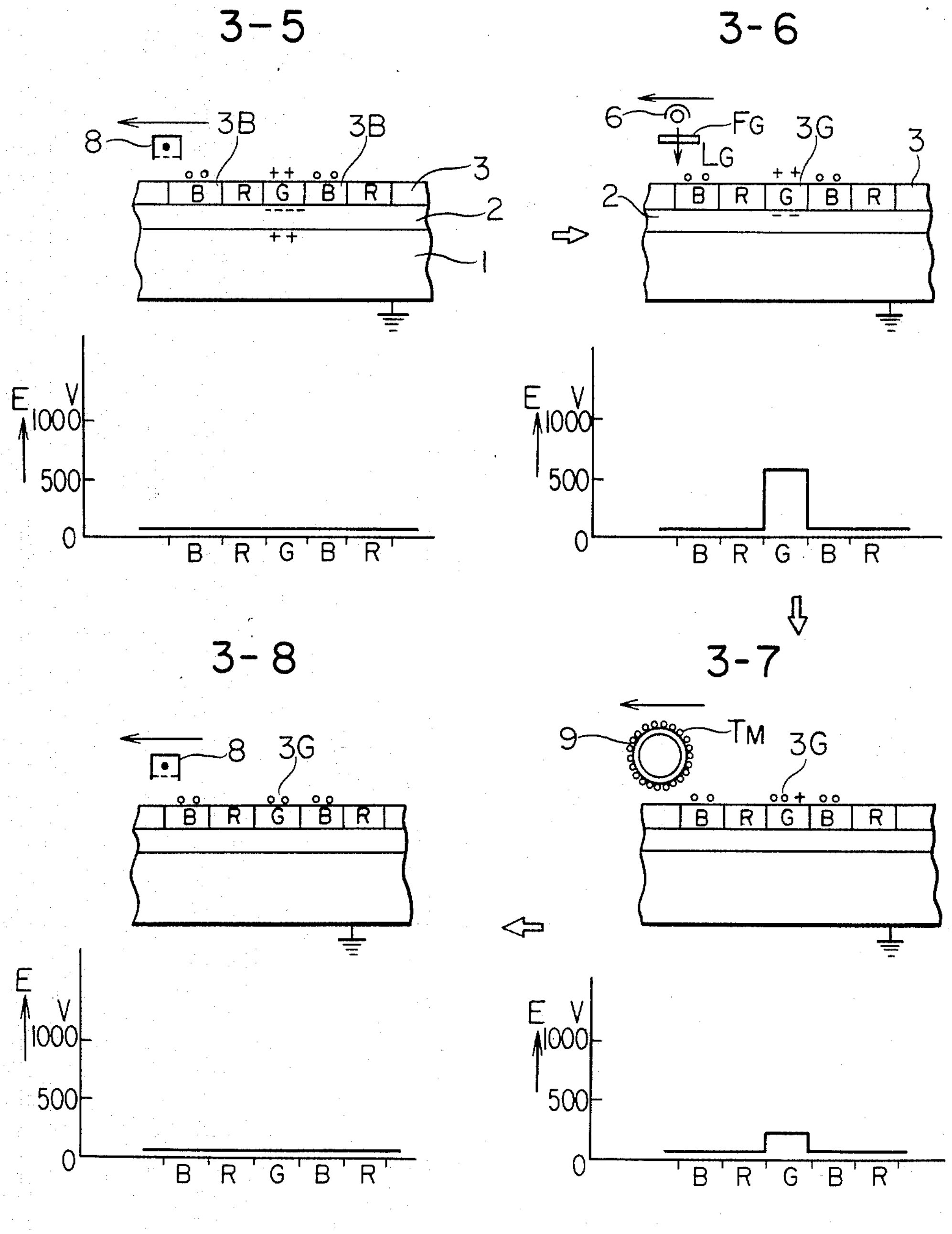

The photoreceptor to be used in this invention, a method for the production thereof, and a process for the image formation thereby will be illustrated by making reference to FIGS. 1 through 3.

FIG. 1 shows schematically cross-sectional views of examples of the photoreceptor of this invention. On a conductive member 1 is provided a photosensitive layer 2, on which are further superposedly provided three layers including a complex filter comprised of a group of finely arrayed red(R), green(G) and blue(B) color separation filter elements. Conductive member 1 may be made into the cylindrical or endless-belt form or, if necessary, a discretional form or structure using a metal such as aluminum, iron, nickel, copper, or an alloy of these metals.

Photosensitive layer 2 is formed on conductive member 1 by vacuum-depositing or coating a binder resin into which is dispersed a photoconductive material comprised of sulfur, selenium, amorphous silicon or an alloy of these with tellurium, arsenic, antimony, etc., or inorganic photoconductive material such as an oxide, iodide, sulfide or selenide of such a metal as zinc, aluminum, antimony, bismuth, cadmium, molybdenum, or the like. Alternatively, the layer may be formed on conductive member 1 by vacuum-depositing or coating in like manner a resin into which is dispersed an organic photoconductive material such as vinylcarbazole, anthracene-phthalocyanine, trinitrofluorenone, polyvinyl-carbazole, polyvinyl-anthracene, polyvinyl-pyrrene, polycyclic quinone dye, bisazo dye, or the like. As the binder resin those insulating and transparent resins may be used which include polyethylene, polyester, polypropylene, polystrene, polyvinylchloride, polyvinyl acetate, polycarbonate, acryl resin, silicone resin, fluororesin, expoxy resin, and the like. And those photoconductive materials of the function-separative type divided into charge-generating layer and charge-transfer layer may also be used.

Layer 3 comprising the foregoing complex filter is, for example, one comprised of complex filter 3*a* alone as shown in FIG. 1 A; one having an interlayer 3*b* as a filling or insulating layer between the complex filter layer and photosensitive layer 2 as shown in FIG. 1 B; one with complex filter 3*a* sandwiched by interlayer 3*b* and protective layer 3*c* as shown in FIG. 1 C; or one comprised of complex filter 3*a* and protective layer 3*c* as shown in FIG. 1 D.

The foregoing complex filter 3*a* may be formed by a not less than 70% by weight appropriate setting resin and a 2% to 30% by weight coloring agent, the setting resin being a thermosetting or photosetting resin which can be set by a post-treatment to be solvent-insuolubilized, selected from among acryl resins, silicone resins, polyamide resins, melamine resins, isocyanate resins, cinnamic acid resins, and the like. As for the coloring agent, organic pigments such as, e.g., copper phthalocyanine, methylene blue, cyanine blue, Victoria blue, etc. may be used for the blue filter; organic pigments such as, e.g., brilliant green, malachite green, naphthol green, etc. may be used for the green filter; and organic pigments such as fuchsine, phenosafranine, rhodamine B, naphthol red, etc. may be used for the red filter.

Procedure for the formation of layer 3 comprising complex filter 3*a* on photosensitive layer 2 is such that an ink prepared by dissolving the coloring agent and setting binder resin into an organic solvent such as toluene. benzene, ethyl acetate, methyl-ethyl ketone, acetone or the like, is used to form a filter layer to be made adhere onto photosensitive layer 2 by using a printing process such as the offset printing process, photogravure process, silkscreen process, letterpress process or the like, or the photoresist process, and the filter layer is than hardened by a light of heat treatment to be in the streak or mosaic form. By doing this, the subsequent filter section can be arranged without doing damage to the preceding filter section by a solvent or mechanical force. Where ink is used to print directly on photosensitive layer 2, the photosensitive layer should be a hardened one using a thermosetting resin and, if necessary, should be further subjected to filling treatment. Where photosensitive layer 2 uses a thermoplastic resin or is comprised of an organic photoconductive material, an interlayer 3*b* such as an insoluble-in-solvent insulating film should be provided and the printing made directly on the interlayer. The printing surface of the interlayer may be further protected by a protective layer 3*c*, to improved its mechanical strength.

Alternatively, another method may also be used in which printing is in advance made on protective film 3*c* instead of printing on the photosensitive layer and the film with its printed surface down is superposed onto and adhered to or laminated onto photosensitive layer 2.

The form and array of the color separation filter constituting the foregoing complex filter, although not particularly defined, can be in the row or streak form as shown in FIG. 2 A; for example, if the photoreceptor is of the drum type, the streaks may be allowed to be either perpendicular to or in parallel with the direction of the drum's revolution.

However, those constituted in the mosaic form as shown in FIGS. 2 B and C are usually used. The filter element size as the color's repeating unit width is desirable to be from 30 to 500 μm (l in FIG. 2). If the filter element size is extremely small, it tends to be affected by other color portions adjacent thereto, and if the width of a single primary color element is equal to or less than the toner particle's diameter, it is difficult to make such a filter. On the other hand, if the filter element size is extremely large, the resolution and mixed color formability of the resulting image is lowered to thereby deteriorate image quality. FIGS. 1 A through D and FIGS. 2 A through C each shows the case where a three-color separation filter (red, green and blue) is provided. In these drawings R represnts red, G represents green and B represents blue.

The multicolor image forming process with use of the photoreceptor of this invention will be illustrated below: FIG. 3 [1] through [8] are drawings showing schematically the image forming process, making reference to part of a photoreceptor which uses an n-type semiconductor such as cadmium sulfide as the photosensitive layer. In FIG. 3, numbered 1 and 2 are a conductive member and a photosensitive layer, respectively, as defined in FIG. 1, and 3 is a layer comprising a high-resistance three-color(B.G.R) complex filter. The graph given underneath each of the drawings in FIG. 3 shows the potential on the surface of each part of the photoreceptor.

Firstly, when a positive corona discharge is applied by a charger 4 to the entire area, a positive charge is produced on the surface of layer 3 comprising the complex filter, and in response to this a negative charge is induced at the interface between photosensitive layer 2 and layer 3 comprising the filter, whereby the photoreceptor is in the state as shown in FIG. 3 [1].

Subsequently, an alternating current or negative discharge is given by charger 5 having an exposure slit to the surface of complex filter 3 to thereby make imagewise exposure according to a multicolor original with the charge on the filter's surface being erased.

In the photoreceptor of this invention, as has been mentioned, the image formation is carried out by making multicolor (red, green and blue) imagewise exposure, but in order to make it more comprehensible, the image forming process will be explained taking on original having a red image alone as an example.

FIG. 3 [2] shows the condition of the part where imagewise exposure (arrow Lr) is made according to the above-mentioned red image. Red light Lr passes through the red separation filter section 3R of Layer 3 to make the photosensitive layer 2 thereunderneath conductive, so that most of the positive charge on layer 3 is erased and at the same time the foregoing negative charge induced in photosensitive layer 2 is also erased, whereby the surface potential becomes almost zero potential.

In contrast, in the green and blue color separation filter sections 3G and 3B, because they do not allow red light Lr to pass therethrough, the positive charge on layer 3 is partly erased, but the foregoing negative charge in photosensitive layer 2 remains intact, and a charge corresponding to the remainder of the foregoing partly erased positive charge is induced in conductive member 1. In such the charge disposition, the surface potential on the green and blue color separation filter sections 3G and 3B becomes almost zero potential. However, a scorotron charger may be used as charger 5 with its grid voltage controlled to thereby obtain a uniform surface potential, e.g., −200 V. Accordingly, the complex filter, although it has a charge pattern as a primary latent image thereinside, is unable to form a toner image because no surface potential difference is present.

Subsequently, a specific light to form a potential pattern on only one of the three primary color sections of the separation filter elements of complex filter 3, e.g., the blue light (arrow LB) obtained by light source 6 and a blue filter FB, is used to make an overall exposure. In this instance, part of the negative charge on photosensitive layer 2 underneath separation filter 3B which allows blue light LB to pass therethrough and the positive charge on conductive member 1 are neutralized, and positive and negative charges corresponding to the portion of separation filter 3B as shown in FIG. 3[3] remain between layer 3 and photosensitive layer 2, whereby a positive surface potential is provided on complex filter 3. This is then developed by a developing device 7 carrying a negative yellow toner Ty as shown in FIG. 3[4], whereby an yellow toner image is formed on the portion of separation filter 3B. The surface potential partially still remains unsaturated by the toner in the area of separation filter 3B where the yellow toner image is formed, so that, as is shown in the lower graph, a relatively high surface potential remains to leave room for allowing a different toner to adhere thereto in the development of the subsequent process.

Upon this, the surface of layer 3 is subjected to a negative corona discharge to be recharged by an alternating current or negative direct current, preferably by use of a scorotron charger 8 to thereby restore layer 3 to the condition of a flat surface potential as shown in the lower graph of FIG. 3[5], which is the same condition as that shown in FIG. 3[2].

A green light (arrow LG) obtained by light source 6 and a green filter FG is then used to make an overall exposure, whereby, as is shown in FIG. 3[6], the negative charge of photosensitive layer 2 and the positive charge of conductive member 1 are neutralized, and thus a high surface potential as shown in the lower graph is obtained in the portion of 3G of layer 3. This is then developed by a developing device 9 carrying a magenta toner TM, thereby obtaining a magenta toner image in the area 3G. Subsequently, after recharging (FIG. 3[8]), a red light obtained through a red filter FR is used to make an overall exposure, but at this time no potential pattern is produced nor is the development by a cyan toner TC performed. The thus formed yellow toner image and magenta toner image are then transferred onto a recording sheet of paper and then fixed. Consequently, the resulting image composed of yellow and magenta colors is visualized as a red image on the sheet.

The above description has been made with respect to where the original used is of a red image, but even in the case of an original being of a white, green, blue, yellow, magenta, cyan or black image, the color reroduction can be made likewise by the combined use of the three-color separation and additive primary color toners. FIG. 4 is a diagrammatic table for explaining the color reproduction process when such various color originals are used. In FIG. 4 the row direction represents color tones of originals, while the column direction represents the process steps up to the formation of toner images when various color originals are used. The marking ' ○ ' is for the primary image formation, the ' ◌ ' for the secondary image formation, and the ' ⊘ ' for each color toner image forming step. And the arrow '↓' represents that the condition shown in the above row frame is maintained intact, while the blank column represents the portion where no latent image formation takes place.

In addition, in the above description an n-type semiconductor is used as the photoreceptor, but a p-type semiconductor photoreceptor may also be used, which is quite the same basically as the n-type semiconductor except that the positive-negative sign of the charge caused thereby is inverse. If the photoreceptor is one usable as either of the n type or of the p type, it may be used of course as either type one.

As is apparent from the above description, the photoreceptor of this invention is one comprising a photosensitive layer having thereon an insulating complex filter protected by a desired amount of a setting resin, and is so designed as to obtained a multicolor image by the image forming method that the photoreceptor is exposed imagewise only one time to thereby form a primary latent image thereon, then subjected to overall exposure by the three-color separation process to form secondary latent images by the colors of the color separation filter constituting the complex filter, and then the process of being developed by the corresponding color toners and recharged is repeated, thereby obtaining a multicolor image.

The foregoing complex filter-containing layer is allowed to be either a complex filter layer alone or one comprising in combination a protective layer composed of an insulating film. The thickness of the layer including the complex filter is normally from 10 to 100 μm, and preferably from 20 to 50 μm. The complex filter is comprised of a more than 70% by weight setting resin as the binder thereof and 2 to 30% by weight soluble-in-organic-solvent organic dyes or pigments. which are contained in an amount of preferably 5 to 500 μg per unit area. In addition, in order to improve the ease of preparing the complex filter, a plasticizer may be added, and further, in order to prevent the possible deterioration of the coloring agent by ultraviolet rays, an ultraviolet absorbing agent such as Tinuvin may be added.

The preparation of the complex filter can be made suitably by printing with an ink prepared by dissolving the foregoing resin and coloring agent into an organic solvent, utilizing a printing technique such as the letter press process, planographic process, intaglio printing process, relief offset lithography, intaglio offset lithography, silk-screen process or the like, or photoresist technique.

Any photoreceptor is usable as the photoreceptor having the above complex filter as long as it is of the type used practically in ordinary electrophotographic processes, but where a photoreceptor comprising a resin into which is dispersed inorganic semiconductor particles such as, e.g., of zinc oxide, cadmium sulfide, etc. is used, the photoreceptor is required to be subjected to the following treatment: That is, in order to smooth the numberless pits or cavities present on the photosensitive layer to prevent the possible deterioration of the photoconductivity due to the penetration of a filter ink thereinto, a filling layer is to be provided and on the filling layer should be printed a complex filter.

Alternatively, a complex filter is in advance printed on a protective layer, and the layer with its printed surface side down is made adhere to and formed on the filter surface of the photosensitive layer. As the resin for use in constituting the photosensitive layer, for example, thermosetting or photosetting acryl resins, silicone resins, polyamide resins, melamine resins, isocyanate resins, cinnamic acid resins or the like should be used to form an insoluble-in-solvent photosensitive layer.

As the method of forming a multicolor image by using a photoreceptor having the foregoing complex film, as has been mentioned, a method which utilizes a charge induced in the photosensitive layer, the so-called NP process, is used, but in forming a secondary latent image by overall exposure from the second stage on, recharging is needed to remove the evil influence by the residue on the first latent image. The recharging is carried out by AC or negative DC discharge or preferably by the negative corona discharge by a scorotron charger.

EXAMPLES

The present invention will be illustrated in detail by the following examples, but the embodiment of this invention is not limited thereto.

EXAMPLE 1

Figure 5:
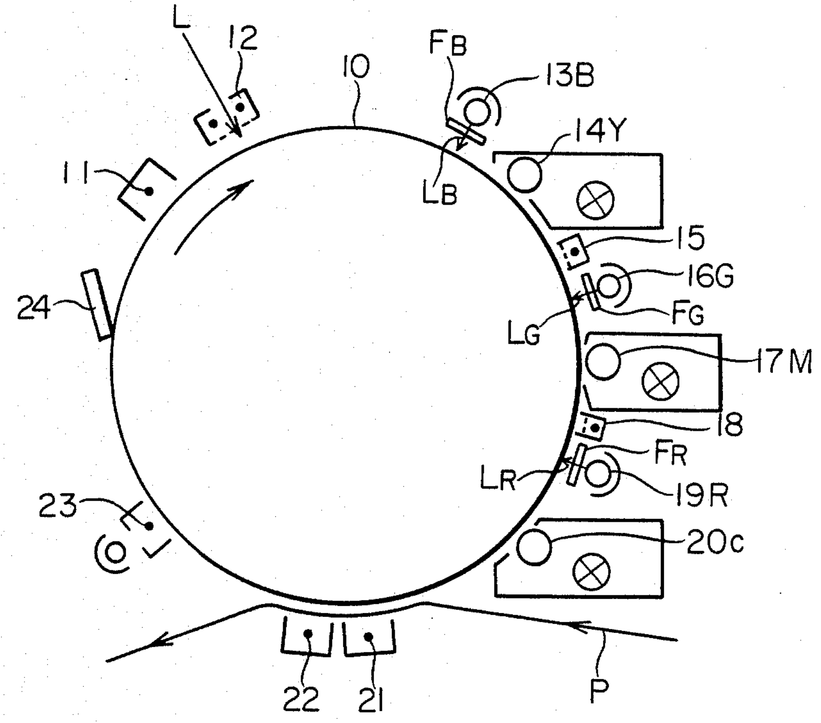
FIG. 5 is a cross-sectional view of a principal part of a multicolor image forming apparatus for explaining an example of this invention.

FIG. 5 is a cross-sectional view of a principal part of a multicolor image forming apparatus for making copies from a multicolor original composed of three primary colors, blue, green and red for explaining the present example, wherein 10 is a photoreceptor, 11 is a positive DC primary charger, 12 is a scorotron charger for negative DC corona discharging having a slit for an imagewise exposure light L, 13B is a light source with a blue filter FB to emit a blue light LB, and 14Y is a developing device which holds an yellow toner. 15 is a scorotron charger for negative DC corona discharging, 16G is a light source with a green filter FG to emit a green light LG, 17M is a developing device holding a magenta toner, 18 is a scorotron charger for negative DC corona discharging, 19R is a light source with a red filter FR to emit a red light LR, and 20 is a developing device holding a cyan toner. P is a recording paper, 21 is a transfer electrode, 22 is a separation electrode, 23 is a residual charge removing neutralizer for emitting a white light from behind the electrode to perform neutralization, and 24 is a residual toner cleaning blade.

Photoreceptor 10 is one prepared in the manner that on an aluminum support drum is provided a 45 μm-thick cadmium sulfide resin photosensitive layer, the surface of this layer is filled with about 0.5 μm-thick thermosetting acryl resin, after that the three-primary-color inks shown in the following table are used to print a 20 μm-thick mosaic complex filter (l=100 μm) as shown in FIG. 2 B by the screen process on a 20 μm-thick Mylar film, and then this is made adhere onto the photosensitive layer.

The above photosensitive layer was formed by spray coating a photosensitive liquid comprised of 100 parts by weight of cadmium sulfide, 40 parts by weight of a thermosetting silicone modified acryl resin and 100 ml of toluene.

TABLE

| | Red ink | | Green ink | | Blue ink | |
|---|---|---|---|---|---|---|
| | Component | Part by wt | Component | Part by wt | Component | Part by wt |
| Matrix resin | Thermosetting resin | 100 | Thermosetting resin | 100 | Thermosetting resin | 100 |
| Coloring dye | C.I. acid yellow 19 | 1.5 | C.I. acid yellow 19 | 5.0 | C.I. acid blue 1 | 5.0 |
| | C.I. acid red 94 | 4.0 | C.I. reactive green 5 | 3.5 | C.I. acid red 87 | 0.5 |
| | | | C.I. acid blue 1 | 0.2 | | |

The above-constructed photoreceptor 10 is first subjected to uniform positive charging by charger 11, then subjected to the action of AC charger 12 and at the same time to scanning exposure by the imagewise exposure light L from an original in three primary colors: blue, green and red. Thus, on the photoreceptor 10 are formed primary latent images corresponding to the respective strengths of the iamgewise exposure lights from the original by the three color separation filter elements of the complex filter. Subsequently, the photoreceptor is subjected to an overall exposure LB by means of a white light source 13B having a blue filter FB to thereby form an electrostatic image corresponding to the foregoing primary latent image in the blue separation filter's area, and the electrostatic image is then yellow color-developed by yellow toner-holding developing device 14Y.

After that, the residual electrostatic image in the blue separation filter's area is erased by a netative scorotron charger 15, than the photoreceptor is subjected to overall exposure LG by white light source 16G having green filter FG and then magenta color-developed by magenta toner-holding developing device 17M.

Next, the residual electrostatic image is erased by negative scorotron charger 18, then the photoreceptor is subjected to overall exposure LR by white light source 19R having red filter FR, and then cyan color-developed by cyan toner-holding developing device 20. Thus, on the photoreceptor is formed a multicolor toner image corresponding to the original, and the toner image is then transferred by transfer electrode 21 onto a timely supplied recording paper P, and the paper is separated by the action of separation electrode 22 from the photoreceptor and then fixed by a fixing device (not shown). On the other hand, the photoreceptor 10 after the image transfer is neutralized by neutralizer 23, and then cleared of the residual toner by cleaning blade 24 thereby to be ready for the subsequent image formation.

The development in this invention is desirable to be made by the magnetic brush method, and the developer for use in the development may be either a one-component developer which uses a nonmagnetic or magnetic toner or a two-component toner which uses a mixture of a toner with a magnetic carrier such as iron powder. In the development, a method of rubbing directly with a magnetic brush may be used, but in order to avoid damaging the formed toner image in and after the second development, it is more desirable to use such a developing method wherein the developer layer does not touch the surface of the photoreceptor by way of setting the gap between the development sleeve and the photoreceptor so as to be larger than the thickness of the developer layer on the sleeve as described in, e.g., U.S. Pat. No. 3,893,418, Japanese Patent Publication Open to Public Inspection (hereinafter referred to as Japanese Patent O.P.I. Publication) No. 18656/1980 and Japanese Patent Application Nos. 57446/1983, 238295/1983 and 238296/1983. In this process, the developing method is desirable to be such that a one-component developer comprised of a nonmagnetic toner alone or a two-component developer containing a nonmagnetic toner which allows to freely choose a desired color is used, an alternating electric field is formed in the developing area, and the development is carried out without contacting the electrostatic image support with the developer. The developer to used in this instance may also be one using a magnetic toner. The color toner to be used in the development comprises a binder resin of the prior art used for ordinary toner, various colored or colorless coloring agents such as organic or inorganic pigments or dyes, various magnetic additives, and the like. Any electrostatic image developing toners prepared by the prior art may be used. As for the carrier, any of various known carriers including magnetic carriers such as those obtained by resin-coating the iron powder or ferrite powder usually used in developing electrostatic images, those obtained by dispersing a magnetic material into a resin, and the like.

In addition, those developing methods as described in Japanese Patent Application Nos. 249669/1983 and 240066/1983 which we filed earlier may also be used.

EXAMPLE 2

In similar manner to that of Example 1 a 5 μm-thick (l=150 μm) complex filter was formed on a 20 μm-thick polyethylene terephthalate film by using inks which use an ultraviolet-setting resin as a matrix resin by the photoresist process by way of sequentially printing and setting B.G.R. filter elements, and the filter was made adhere onto a 35 μm-thick cadmium sulfide photosensitive layer, whereby a photoreceptor 10 was formed. This photoreceptor was used and in the same manner as in Example 1 a three-color image was formed, then a high-quality image with no doubling was obtained.

Above-described are the examples of color copying apparatus using a three-color separation filter and three-primary-color toners. The embodiment of the present invention, however, is not limited by the examples but extensively applicable to various multicolor image recording apparatuses, color photographic printers, and the like. It goes without saying that the colors of the separation filter and the combination of toners corresponding thereto can be freely selected according to the purpose for which the photoreceptor is used.

The term 'charging' used herein includes also the case where the surface potential obtained when charging becomes zero or the surface charge vanishes. In the above description the spectral characteristics of the light for use in overall exposure is obtained by using blue(B), green(G) and red(R) filters, but the same may also be obtained by nonfilter means and, besides, the spectral characteristics are not limited to B. G. R. What is essential for the spectral characteristics is to be capable of forming a potential pattern in the specific filter area alone corresponding to a specific light used in overall exposure of the photoreceptor. Therefore, the term 'a plurality of different filters' herein means also a photoreceptor having a layer comprised of a single color separation filter (a filter that allows the passage of a specific wavelength light alone) and a nonfilter portion. This nonfilter portion is regarded as a colorless transparent filter and included in the foregoing 'a plurality of different filters.' In this instance, the colorless transparent filter should be prepared using toner particles containing no coloring agents.

As is apprent from the above description, the photoreceptor of this invention is one having a complex filter excellent in the wear resistance, moisture resistance, adherence, electric characteristics, and the like, so that it is free from such evils as the deterioration in quality of and deformation of the filter, color diffusion, and the like, and thus can be a stable multicolor image forming photorecepto capable of being used over an extensive period of time. And when forming an image by using such the photoreceptor, a very good quality multicolor image can be reproduced.

Besides, the photoreceptor of this invention needs only a single imagewise exposure unlike conventional ones requiring a series of imagewise exposures, and requires no register of the respective color toner images in transfer, thus enabling to make compact image forming apparatus, to speed up the image formation and to improve the reliability thereof.

METHOD FOR THE PREPARATION OF FILTER LAYER-HAVING PHOTORECEPTOR

The use of such the mosaic filter-having photoreceptor has many advantages as has been mentioned above, but in what way the filter should be provided on the photoreceptor is an important question. That is, it costs much labor with many technical difficulties to construct a filter layer by making a plurality of different coloring materials adhere in the manner of direct printing or transferring onto the surface of a photoreceptor which, although relatively fragile, is required to be extremely smooth and perfectly free of any defects such as scratches. Even such a filter thus obtained is disadvantageous in respect that the adhesion to the photoreceptor is weak and poor in the wear resistance, the filter has an adverse effect upon the photoconductivity of the photosensitive layer, and the like.

It is an object of the present invention to provide a method for the production of a photoreceptor, the method being capable of easily and efficiently producing a photoreceptor having a filter layer that is excellent in the wear resistance and does not at all impair the photoconductivity.

The above object is accomplished by a method for the production of a photoreceptor, the method comprising a process of providing a filter layer on a transparent thin layer that is provided through an adhesion layer on a support; a process of peeling the foregoing thin layer from the support; and a process of making the peeled thin layer with the filter layer adhere onto the upper surface or the reverse surface of the photosensitive layer, and also by a method for the formation of an image by using the photoreceptor.

Suitably usable as the foregoing support used in this invention is a film web having an appropriate hardness and elasticity, examples of which include various plastic films such as polyethylene terephthalate film, polycarbonate film, polystyrene film, polyethylene film, triacetate film, and the like. The thickness of such supports, although it differs according to the nature of the support used, is desirable to be about 100 $\mu$m.

Between the support and the thin layer to be later provided thereon with a filter layer should be provided an adhesion layer which serves to make both temporarily adhere to each other. No particular respricions are put on materials for the adhesion layer; any known adhesives may be used. However, for the purpose of retaining close contact rather than adhesion from the viewpoint of the electric insulation, chemical inactivity, etc., silicone oil (such as Shin'etsu Silicone KE-96), and for the purpose of stressing adhesion, silicone varnish (such as Shin'etsu Silicone KR101-10) and the like may be suitably used.

The foregoing thin layer should be constructed using similar plastic materials to those usable as the support, and its thickness, although not specially restricted, is desirable to be as small as possible within the strength range of the layer being able to be handled as an independent layer when peeled apart from the support, and in practice preferably from 5 to 100 $\mu$m. The thin layer, when provided on the upper side of the photosensitive layer, is desirable to have a resistivity of not less than $10^{13}$ $\Omega$cm, but, when provided on the lower side (reverse) of the photosensitive layer, has no need of restricting the resistivity.

The foregoing support and/or the thin layer may be subjected to treatment of a Teflon coat, etc, for adjusting the degree of peeling from the adhesion layer. Namely, if the adhesion between the thin layer and the adhesion layer is stronger than that between the adhesion layer and the support, then the adhesion layer, when peeling, is peeled attaching to the thin layer from the support, while, if the adhesion strength relation is reversed, then the adhesion layer remains on the support side, whereby the adhesion layer-free thin layer is obtained.

FIG. 6 is a schematic drawing showing a cross-sectional view of the support having the above-mentioned thin layer, wherein numbered 101 is the support, 102 is the adhesion layer and 103*b* is the thin layer.

In the method of this invention, a filter layer is provided on the surface of the thin layer on the support. As the method for providing the filter layer, a method in which inks containing desired colors-having coloring agents and a transparent resin, preferably a photosetting or thermosetting resin, are used to form a desired pattern-having filter layer by directly printing or by using the photoresist technique on the foregoing thin layer may be suitably used, and other methods for transferring coloring agents by heat, and various other equivalent methods may also be used.

The formation of the filter layer on the thin layer, as has been mentioned, may be carried out in the manner that an ink prepared by dissolving a coloring agent and a setting binder resin into an organic solvent such as toluene, benzene, ethyl acetate, methyl-ethyl ketone, acetone or the like is used to provide a filter by a printing technique such as the offset process, gravure process, screen process, silk process or letter press process, or the photoresist process, and the filter layer is then set by a light or heat thereby to be made in the streak or mosaic form, and this process is repeated, whereby the subsequent filter section can be provided without damaging by the solvent or mechanical force the preceding filter section, and by repeating this process a necessary number of times for desired kinds of color, a required complex filter layer can be completed. The thickness of the filter layer is desirable to be normally from 1 to 10 $\mu$m taking into account the transmittance characteristics. The thin layer including the filter layer thus obtained is from 5 to 100 $\mu$m, and preferably from 10 to 50 $\mu$m.

On the thus obtained complex filter is also desirable to be provided further a transparent protective layer consisting of a resin or the like. By doing this the filter layer can be protected from possible wear, scratches, stain, etc. when in use. FIG. 7 A is a cross-sectional view of the web after the complex filter layer is printed thereon comprising the foregoing support 101, adhesion layer 102, and thin layer 103*b*. 103*a* is the filter layer, wherein R, G and B represent red, green and blue filters, respectively. FIG. 7 B shows one having additionally a protective layer 103*c* on the filter layer.

Subsequently, from the support the filter layer-having thin layer is peeled to be made adhere onto the surface of the foregoing photoreceptor. In this instance, the thin layer is allowed either to have its filter layer side adhere to the surface of the photoreceptor or to have its reverse side, i.e., the adhesion side before peeling, adhere to the surface of the photoreceptor. As for the adhesion method, where the adhesion layer is adapted to remain on the support side when peeling, an adhesive should be uniformly coated or sprayed to be attached onto the surface of the photoreceptor or the thin layer, and then the peeled thin layer's desired plane should be pressed, while, where the adhesion layer is adapted to be peeled being attached to the thin layer side, the adhesion layer plane of the peeled thin layer as it is should be applied directly to the surface of the photoreceptor. Where the filter layer side of the thin layer peeled with the adhesion layer attached thereto is to be made adhere to the surface of th photoreceptor, to the adhesive-provided plane of the photoreceptor is applied the filter layer side of the thin layer, and then the adhesion layer attached to the surface should be removed by using a sovlent or the like.

The adhesive for use in applying the thin layer to the photoreceptor may be one similar to that used for the adhesion layer provided for the photoreceptor and the thin layer. In making the thin layer adhere to the photoreceptor, the application of heat or pressure can improve the close adhesion of them.

Figure 8:
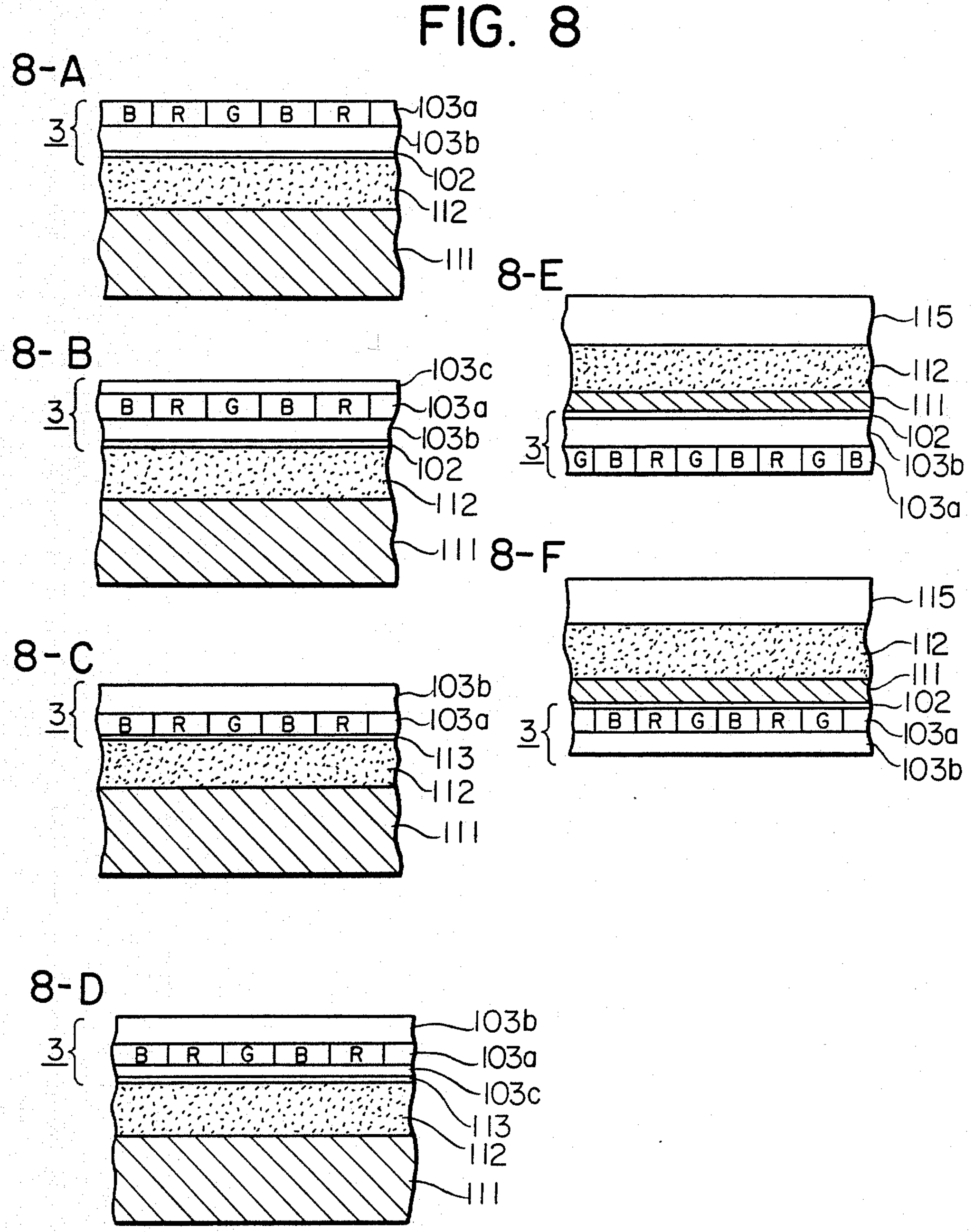
FIGS. 8 A through F are cross-sectional views of examples of the photoreceptor of this invention.

FIG. 8 shows schematic drawings of cross-sectional views of examples of the photoreceptor prepared in the above manner, wherein on conductive material 111 is provided photosensitive layer 112, onto which is made adhere a layer 103 consisting of complex filter layer 103*a* and thin layer 103*b*, the complex filter layer 103 being comprised of a group of necessary fine color separation filter elements prepared in the foregoing manner (in the drawings, red(R), green(G) and blue(B) color separation filter). 102 or 113 is an adhesion layer serving to make the thin layer having the filter layer and the surface of the photoreceptor adhere to each other. FIG. 8 A shows an example of thin layer 103*b* side adhering to the surface of the photoreceptor, FIG. 8 B shows an example of the thin layer side adhering to the surface of the photoreceptor in the case where a protective layer is in advance provided on the filter layer, FIG. 8 C shows an example of the case where the filter layer side of a layer consisting of filter layer 103*a* and thin layer 103*b* is made adhere to the surface of the photoreceptor, FIG. 4 D shows an example of th photoreceptor wherein the protective layer 103*c* side of the layer comprising filter layer 103*a* on which is in advance provided protective layer 103*c* is made adhere to the surface of the photoreceptor.

The present invention can also apply to the production of a photoreceptor having the filter layer underneath the photosensitive layer. The image forming method which uses this photoreceptor is one that is described in Japanese Patent Application No. 199547/1984, and is characterized by the use of a photoreceptor comprising a photosensitive layer sandwiched between a transparent insulating layer and a transparent conductive member; primary charging and secondary charging being made from the photosensitive layer side; and imagewise exposure and overall exposure by a specific light being made through the filter on the reverse side. Shown in FIG. 8 E and FIG. 8 F are examples of the photoreceptor of this type. Shown in FIG. 8 E is one wherein the thin layer side of a layer consisting of thin layer 103*b* and filter layer 103*a* is made adhere to the surface of transparent conductive member 114, and in FIG. 8 F is one wherein the filter layer side is made adhere to the surface of transparent conductive member 114. 115 is an insulating layer. In these instances, as the transparent conductive member one prepared by forming on a film a conductive layer such as tin oxide by the vacuum deposition or spattering may be suitably used.

And, it is preferred to so make a filter layer comprising a complex filter as to be conductive, thereby the filter layer and the conductive member are so made to be a common layer.

PREPARATION OF PHOTORECEPTOR [1]

A web as shown in FIG. 1 is prepared in the manner that a 20 μm-thick polyethylene terephthalate thin layer is made peelably adhere by use of silicone varnish KR101-10 (Shin'etsu Silicone K.K.) as an adhesion layer onto a 100 μm-thick Teflon-coated polyester film. On the surface of the web is printed a B.G.R.-three-color complex filter layer by the screen process using the inks of the composition as shown in the foregoing table to thereby obtain a multilayer web having the construction as shown in FIG. 7 A. When peeling the multilayer product, the adhesion layer is peeled being attached to the thin layer side.

On the other hand, a photoreceptor in the film form is prepared by providing a 45 μm-thick cadmium resin photosensitive layer on an aluminum-laminated film base, the photosensitive layer being formed by coating a photosensitive liquid composed of 100 parts by weight of cadmium sulfide, 40 parts by weight of thermosetting silicone-modified acryl resin and 100 ml of toluene, on the surface of which layer is further provided an about 0.5 μm-thick filling layer.

Figure 9:
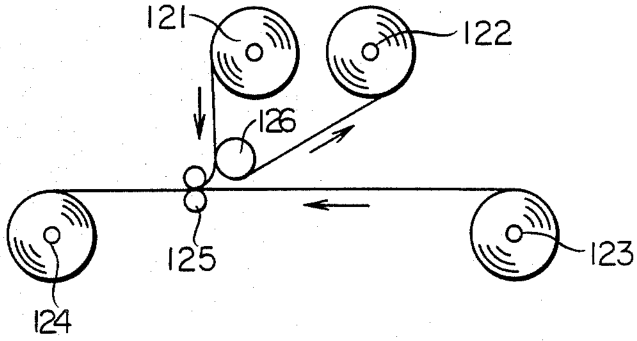
FIGS. 9 and 10 are drawings showing the process of making the filter layer adhere to the photoreceptor.

By means of a device as shown in FIG. 9 the thin layer having the filter layer, being pelled away from the foregoing multilayer web, is laminated on the photosensitive surface of the foregoing photoreceptor to thereby obtain a complex filter-having photoreceptor [1] having the construction as shown in FIG. 8 A. In FIG. 9, 121 is a filter layer-having multilayer web feeding section, 122 is a peeled support take-up section, 123 is a film photoreceptor feeding section, and 125 is a laminating roller pair. The respective webs each is transported in the direction of arrow. The complex filter-having thin layer on the multilayer web is peeled away from the support by inversely rotating roller 126 and pressed on the photoreceptor transported in by laminating roller 125 and at this time made adhere by the adhesion layer provided on the thin layer onto the surface of the photoreceptor. The completed photoreceptor is then taken up by the take-up section 124. Thus, a photoreceptor having a complex film in the accurate form can be prepared highly efficiently without beint accompanied by any loss due to a deformation or the like of the filter layer. The obtained photoreceptor [1] is of the construction shown in FIG. 8 A.

PREPARATION OF PHOTORECTOR [2]

Figure 10:
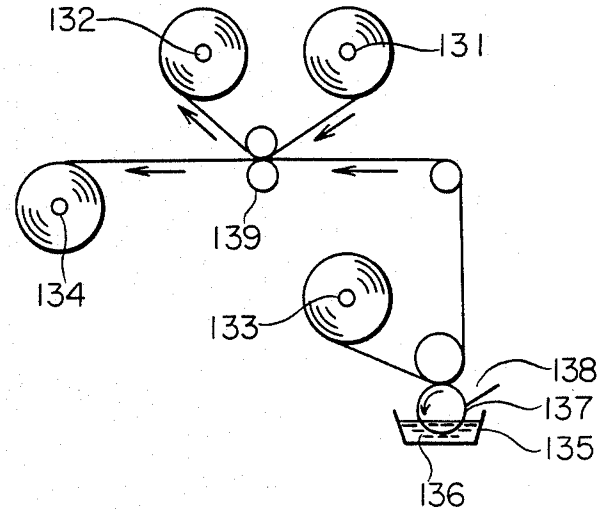

A multilayer web is prepared by printing a complex filter in similar manner to that described previously on a web which is of a construction nearly the same as that in the previous case but differs in respect that the thin layer side is subjected to mold releasing treatment instead of subjecting the support side to the same treatment so that the thin layer is adpated to remain on the support side. The photoreceptor used is one in the same film form as used in the foregoing photoreceptor [1]. By means of the device shown in FIG. 10 the filter layer-havnig thin layer is peeled away from the multilayer web and made adhere onto the adhesive-coated surface of the photoreceptor, whereby a photoreceptor of the construction shown in FIG. 8 C with its filter layer side adhering to the surface of the photoreceptor itself and with its thin layer's back appearing on the obverse side thereof is obtained. In FIG. 10, 131 is a feeding section for the foregoing multilayer web, 132 is a take-up section for the support after pelling the thin layer, 133 is a feeding section for the film-form photoreceptor, and 134 is an take-up section for the completed photoreceptor. 135 is a vat for holding an adhesive 136, and the adhesive 136 is to be coated by coating roller 137 on the surface of the photoreceptor being transported. The coating amount of the adhesive is regulated by doctor 138. The filter layer surface of the multilayer web is pressed on the adhesive-coated surface of the photoreceptor by laminating roller 139, and the filter layer-having thin layer is peeled away from the multilayer web thereby to be made adhere to the surface of the photoreceptor, and then the completed photoreceptor in the film form is taken up by take-up section 134. The adhesion layer-attached support after the peeling of the thin layer is then taken up by take-up section 132.

The obtained photoreceptor [2] is one having the construction shown in FIG. 8 C, and has the advantage that, being protected by the thin layer, the filter layer is strong against the possibility of wear an scratches when in use. The preparation of photoreceptor [2] also can be carried out highly efficiently and stably as in the case of photoreceptor [1], and no deformation or adhesion trouble of the filter layer of the photoreceptor can be recognized.

As is apparent from the above description, the method of producing the photoreceptor of this invention enables to easily and highly efficiently produce a photoreceptor having a complex filter which is excellent in the wear resistance, moisture resistance, adhesion property, electric characteristics, and the like. The obtained photoreceptor is free from such evils as the deterioration in quality, deformation, color diffusion, and the like, and can be a stable photoreceptor durable against the long-term use.

EXAMPLES OF THE CONSTRUCTION OF FILTER SECTION

The method of using the complex filter-having photoreceptor has many advantages as has been mentioned above, but on the other hand, when forming an electrostatic image, by the edge effect the electric field in the periphery of the respective fine filter elements is raised, whereby a large amount of a toner is attached to the periphery to thereby obstruct the attaching of the toner to the adjacent filter elements to thereby deteriorates the color reproducibility. The gradation of the image produced becomes poor, and particularly the reproduction in the highlight area is deteriorated. And in producing the filter, if an overlap portion is produced in each adjacency between the fine elements, the transmittance of the overlap portion becomes significantly deteriorated, so that it causes a substantially unexposed portion, thus remarkably deteriorating the color reproducibility of an image, while if a gap is produced between the filter elements in an attempt to avoid the interfilter overlap, a nonfilter exposure portion appears, so that it also deteriorates the color reproducibility. Hence there is the disadvantage that it is very difficult to prepare the filter section. The object of the present invention is also to provide a photoreceptor which is so designed as to prevent the edge effect or the deterioration of the gradation and color tone of a reproduced image due to the interfilter overlap or gap.

The above object is accomplished by a photoreceptor which comprises a filter layer comprised of a group of a plurality of fine color separation filter elements which allow different wavelength lights to pass therethrough, and the color density inside each of the foregoing respective fine filter elements has a not-uniform and specific distribution.

The color density distribution inside each fine filter element is desirable to be such that the central portion of the fine filter element be high, while the periphery be low. By doing this, the potential in the periphery of each fine filter element after exposure becomes lower than that of the central portion, thus enabling to solve the problem that a toner deposits to excess in the periphery of each fine filter element due to the edge effect. Even if a slight overlap is produced between the fine filter elements adjacent to each other, the color density of the overlapped portion is so small that no substantially unexposed portion due to the formation of significantly low transmittance is produced nor does the deterioration in the gradation or color tone occur. Accordingly, in the preparation of the filter section, if the respective fine filter elements are designed so as to overlap very slightly with one another, the filter section can be easily prepared with no possibility of the appearance of a gap between the filter elements.

The color density, i.e., the transmittance of light, of each filter element, in the maximum transmission wavelength, is desirable to be from 50 to 95% in the center of the filter element, from 65 to 98% in the periphery, and from 5 to 40% in the difference between them.

Figure 11:
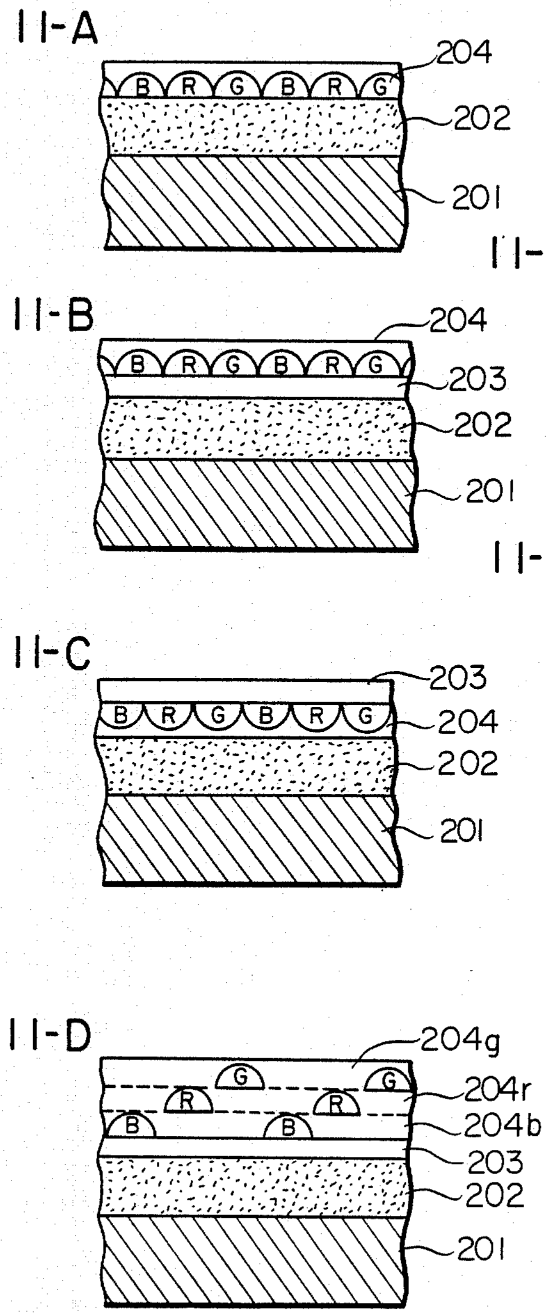
FIGS. 11 A through D are cross-sectional views of examples of the photoreceptor of this invention.

The formation of such the fine filter elements section having thereinside a not-uniform color density distribution is desirable to be made in the manner that the colored fine filter elements layer, the elements each having thickness difference between the central portion and the periphery as shown in FIG. 11 A through D; thick in the center and thin in the periphery, is made adherent directly onto the surface of the photoreceptor by a printing technique or the like, or otherwise is formed on an insulating film, and after that the film is made adhere to the surface of the photoreceptor in either way of placing the film with its film side facing the surface of the photoreceptor or its filter side facing the photoreceptor.

In this instance, the ratio in the thickness between the periphery and the central portion is desirable to be 1.2–4. The surface of the obtained filter is desirable to be smoothed by providing thereon a protective layer composed of a transparent resin or the like in order to prevent the filter section from possible wear or scratches. The plurality of different fine filter elements are allowed to be provided either in the same plane as shown in FIG. 11 A through C or in a multilayer construction with protective layers provided for the respective filter sections in rows as shown in FIG. 11 D. One that has such the construction as shown in FIG. 11 D is advantageous in respect that the filter elements are not directly overlapped when printing, so that the thickness and form of the filter are easily controllable, and even if the electric insulation of the filter sections are low, the elements are insulated being surroundd by the protective layers, thus allowing the wide section of dyes or pigments to be used for the filter sections.

FIG. 11 is of cross-sectional views of examples of the construction of the photoreceptor of this invention. Figure 11 A is for one wherein the filter section is provided directly on the photoreceptor, FIG. 11 B is for one wherein the filter section is provided on a film and the film side is made adhere onto the photoreceptor, FIG. 11 C is for one wherein the filter side of the film is made adhere onto the photoreceptor, and FIG. 11 D is for one which uses the multilayer-construction filter section. In each case, the protective layer is provided for the filter section. In FIG. 11, 201 is a conductive base, 202 is a photosensitive layer, 203 is a filter-printed film layer, B, G and R are blue, green and red filter sections, respectively, and 204 is a protective layer. In FIG. 11 D, 204*b*, 204*g* and 204*r* are the protective layers of the B, G and R filter sections, respectively. In addition, these examples show the photoreceptors having B, G and R filter sections, but the colors of the filter section are not limited thereto and any discretional color filters can be used if necessary.

The preferred method for the formation of the fine filter section of this invention is such that inks containing desired colors-having coloring agents and a transparent resin, preferably a thermosetting or photosentting resin, are used to be printed directly and set on the photoreceptor or on a film to thereby form desired filter sections.

FIG. 11 E is for an example wherein the filter layer is printed on the surface of a transparent conductive base, and FIG. 11 F is for an example wherein the film side of a layer comprised of the filter layer and a film is made adhere onto the surface of a transparent conductive base. As the transparent conductive base in these instances one prepared by forming a conductive layer such as of tin oxide on a film by vacuum deposition or spattering may be suitably used.

PREPARATION OF PHOTORECEPTOR [3]

Figure 12:
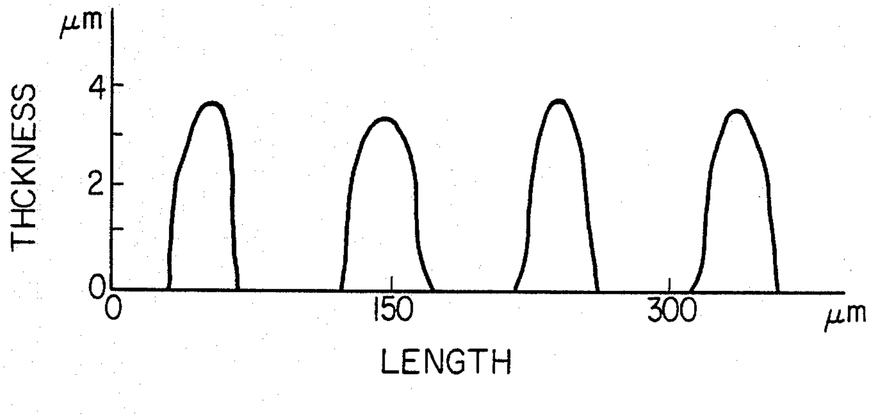
FIGS. 12, 13 and 15 are graphs showing the thicknesses of the filter.
Figure 13:
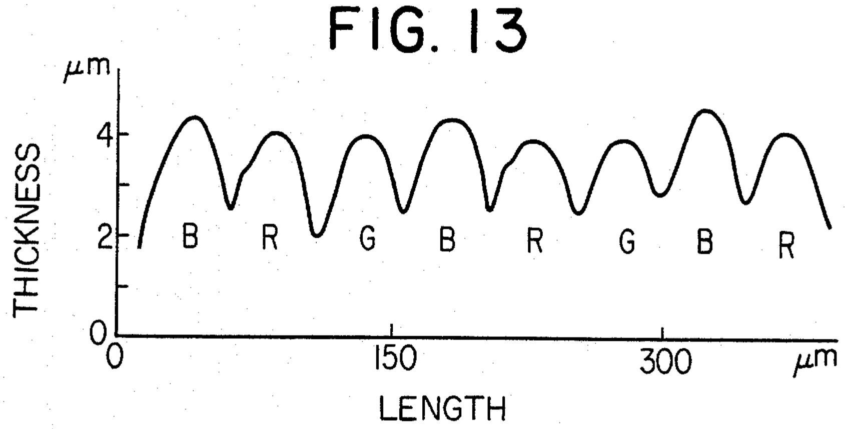
Figure 14:
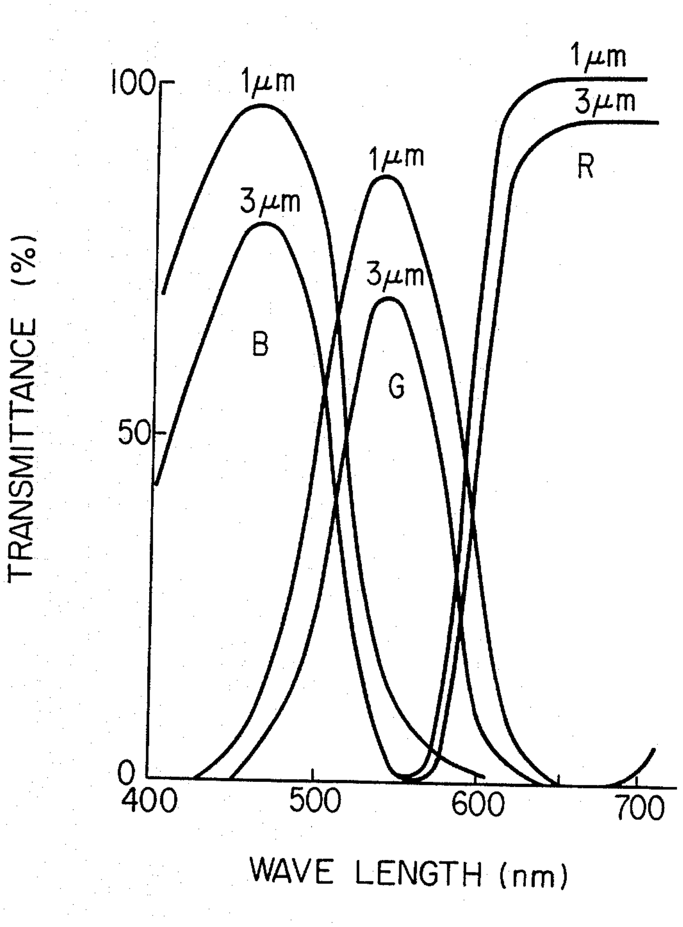
FIG. 14 is a graph showing the spectral transmittance curves of the respective filter elements.

On the surface of a 20 μm-thick polyethylene terephthalate film is printed a B.G.R.-three-color complex filter layer of the pattern shown in FIG. 2 B by the intaglio printing process using inks of the composition shown in the foregoing table, and after setting the pattern, a protective layer is coated and set thereon to thereby smooth the surface. Before the protective layer coating, the thickness of a single filter section and the thickness of the filter section when made into the mosaic form were measured, then it was found that each of the respective B.G.R. filter elements is in the specified form that each element is thick in the center and thin in the periphery as shown in FIG. 12 (G filter alone is shown; the forms of the other filters are also neary the same) and FIG. 13. The spectral absorption curves obtained by separate measurement of the respective filters in thicknesses of 1 μm and 3 μm are shown in FIG. 14. It is seen that because the filter elements each is thick in the central portion and thin in the periphery the color density also is high in the center and low in the periphery.

On the other hand, a photoreceptor in the film form is prepared by providing a 45 μm-thick cadmium sulfide resin photosensitive layer on an aluminum-laminated film base. The above photosensitive layer is one formed by coating a photosensitive liquid comprised of 100 parts by weight of cadmium sulfide, 40 parts by weight of thermosetting silicone-modified acryl resin and 100 ml of toluene, and further provided thereon with an about 0.5 μm-thick filling layer.

On the surface of this photoreceptor is provided a filter layer-having film with its filter side facing the photoreceptor to be made adhere thereto to thereby prepare photoreceptor [3] of the type of FIG. 11 C.

Preparation of PHotoreceptor [4]

Figure 15:
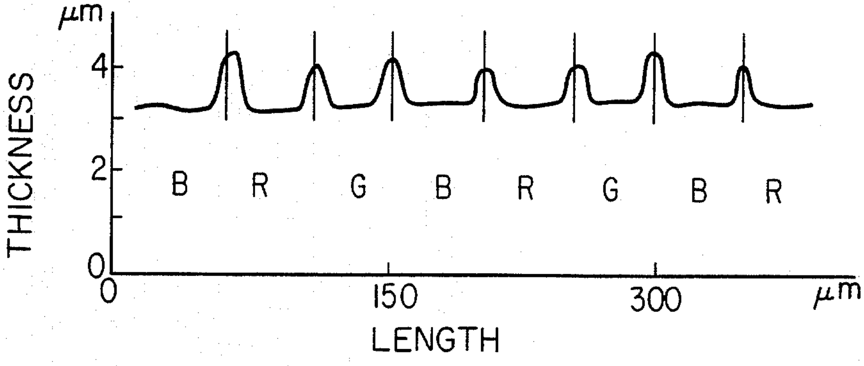

For comparison photoreceptor [4] is prepared which has neary the same construction as in the above instance but differs in that its color densities are uniform with no difference between the center and the periphery; that is, a complex filter of the same pattern as of the foregoing filter layer is prepared by the screen printing process. The thickness of the obtained filter layer was measured in the state before the protective layer coating, then the result as shown in FIG. 15 was obtained. The thicknesses of the respective fine filter elements are almost uniform, but the increase in the thickness due to overlapping is seen in the adjacency between the elements. This filter layer is provided with its filter side facing the photoreceptor to be made adhere thereto as in the case of photoreceptor [3], whereby photoreceptor [4] is obtained.

Subsequently, for comparison, the copying test was repeated by means of the foregoing device in the same manner except that photoreceptor [4] was used in place of photoreceptor [3], then an image which was poor in the color purity become the three-color toner was attached to the periphery of each fine filter element as compared to the case where photoreceptor [3] was used. In the test, nothing but highlight details-lost extremely contrasty copy images were obtained, and thus the usefulness of the present invention was ascertained.

Namely, as indicated in this embodiment, for the photoreceptor which comprises a filter layer comprised of a plurality of fine color separation filter elements each of which allow different wavelength lights with each other to pass therethrough and has specific distribution in color density inside thereof, an image can be formed by the method for the formation of an image as indicated in FIG. 3 which comprises the process for imagewise exposing the photoreceptor and the process for repeating the procedure of uniformly exposing the photoreceptor to a specific light to thereby form a potential pattern on a corresponding section of the filter to the specific light and a developing the pattern with a toner.

Figure 16:
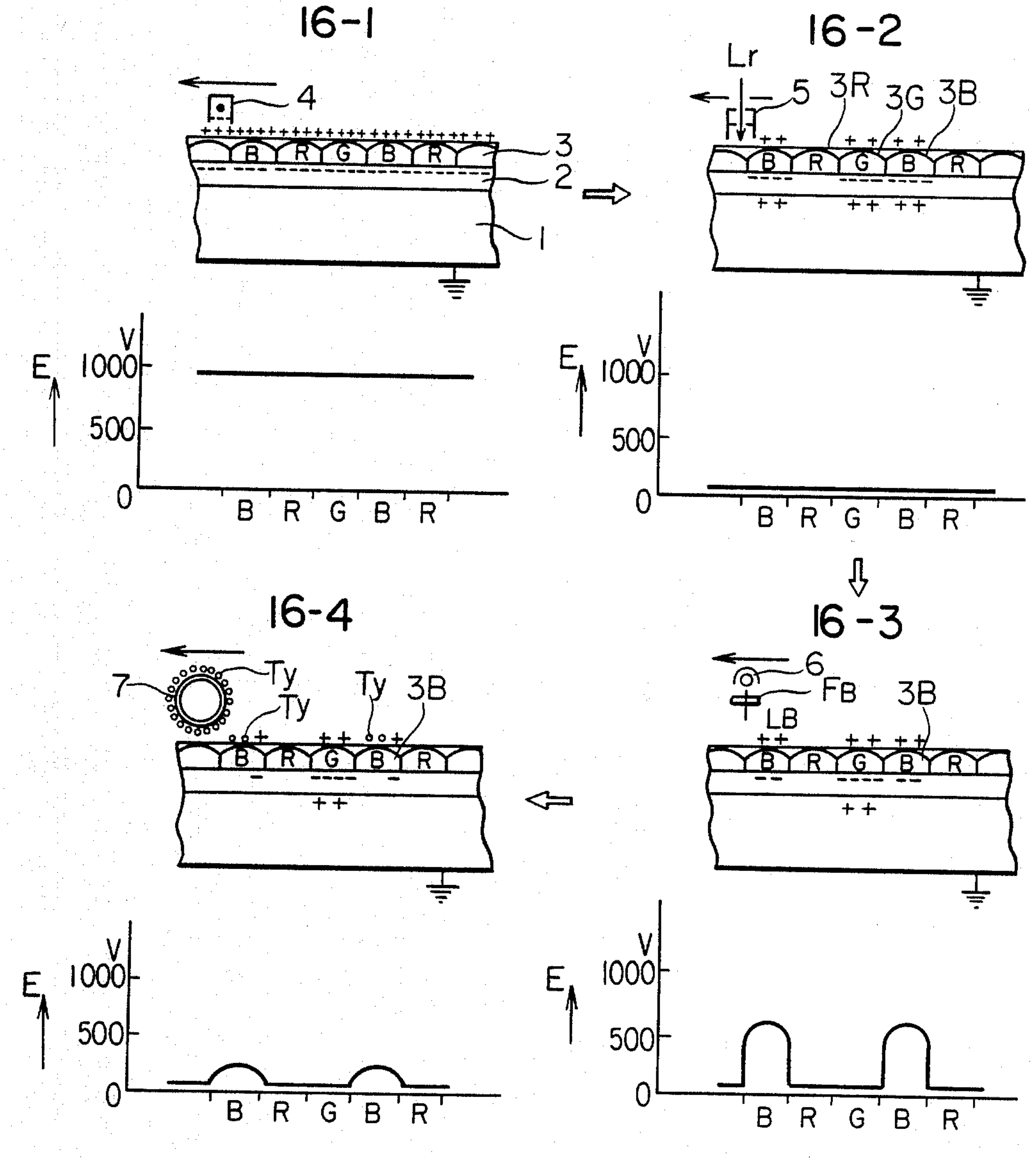
FIG. 16 is an explanatory drawing for the image forming process.
Figure 16:
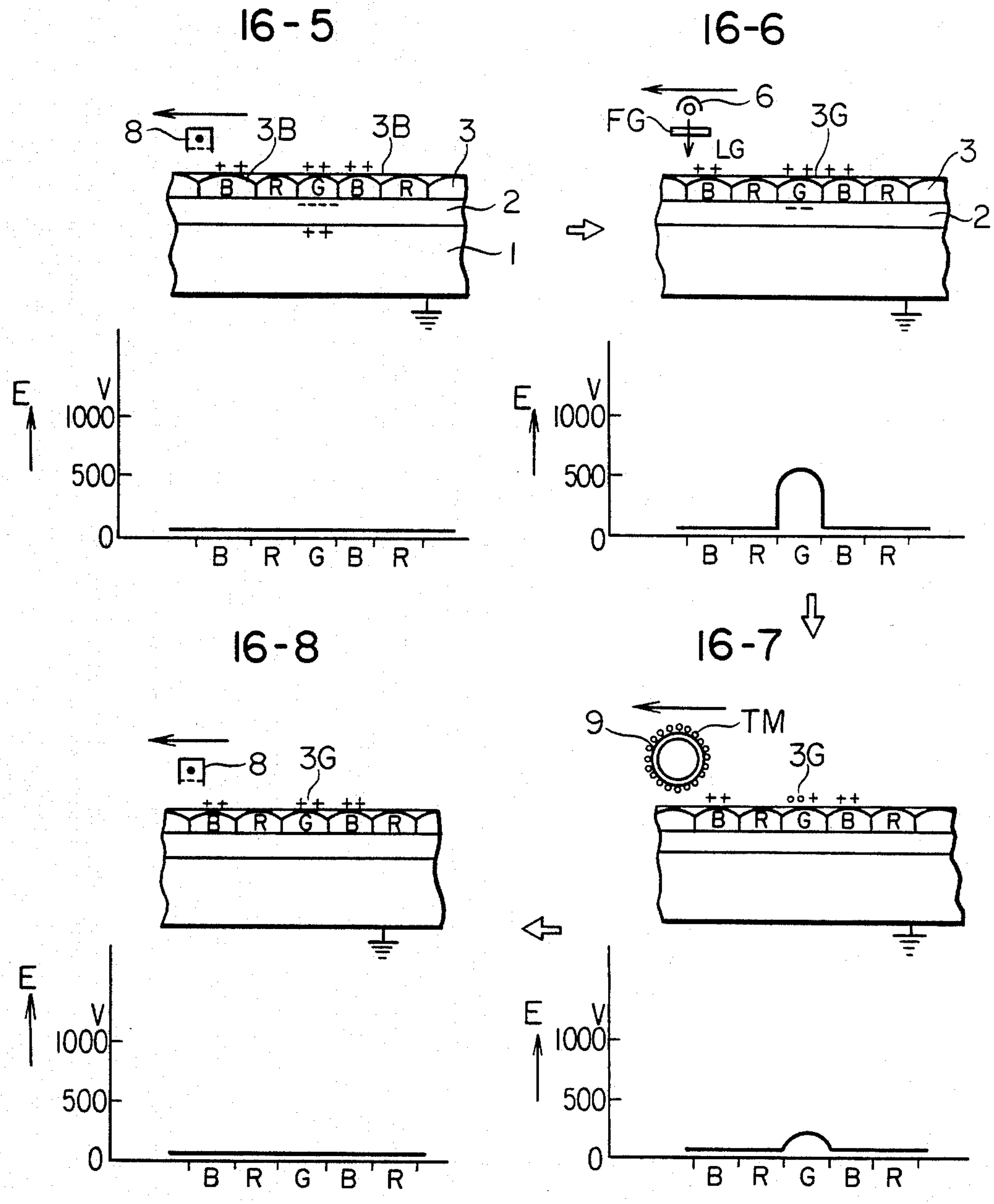

In this image formation, as the color density distribution inside each fine filter elements is so made that the central portion of the fine filter element is high and the periphery thereof is low, the potential in the periphery portion of each fine filter elements after exposure becomes lower than that of the central portion as shown in FIG. 16, thus enabling to solve the problem that a toner deposits to excess in the periphery of each fine filter element due to the edge effect. Even if a slight overlap is produced between the fine filter elements adjacent to each other, the color density of the overlapped portion is so small that no substantially unexposed portion due to the formation of significantly low transmitance is produced nor does the deterioration in the gradation or color tone occur.

What is claimed is:

1. A photoreceptor for electrophotography comprising an electrically insulating layer operable to be subjected to a uniform electric charge and an imagewise exposure thereon, said electrically insulating layer comprising a complex color separation filter layer having plural kinds of color separation filters being juxtaposed in a predetermined arrangement, each of said color separation filters being formed by ink containing a setting transparent resin having a resistivity being not less than $10^8$ ohm-cm and coloring agents being in the amount of 2 to 30% by weight;

a photoconductive layer having two opposed sides, said electrically insulating layer being superposed on one side thereof so that said photoconductive layer is imagwise exposed through said insulating layer when said insulating layer is imagewise exposed, and an electrically conductive layer being superposed on the other side of said photoconductive layer.

2. The photoreceptor for electrophotography of claim 1, wherein said complex filter is in the form of a layer comprising not less than 70% by weight of said resin.

3. The photoreceptor for electrophotography of claim 2, wherein said complex filter-comprising layer consists of said complex filter alone.

4. The photoreceptor for electrophotography of claim 2, wherein said complex filter-comprising layer is comprised of said complex filter and a protective layer.

5. The photoreceptor for electrophotography of claim 4, wherein said complex filter has a resistivity of not less than $10^2$ Ωcm.

6. The photoreceptor for electrophotography of claim 5, wherein said complex filter-comprising layer has a thickness of from 10 μm to 100 μm.

7. A photoreceptor of claim 1 said complex filter comprising a group of plural kinds of minute color separation filter elements each of which causes a light in a different wavelength region with each other to be transmitted respectively and further has a color density showing a specific distribution form that is not uniform.

8. The photoreceptor of claim 7, wherein said distribution form of said color density shows a form that is high at the center of the minute filter elements an is low at the peripheral portion thereof.

9. A method for the production of a photoreceptor for electrophotography, said photoreceptor comprising a high-resistance complex filter comprised of a group of a plurality of different filters and a photosensitive layer, which comprises a process for printing said complex filter into a streak or mosaic form by using plural kinds of inks comprising coloring agents and a setting transparent resin in a medium thereof.

10. The method for the production of a photoreceptor for electrophotography of claim 9, wherein said complex filter is printed to form on said photosensitive layer.

11. The method for the production of a photoreceptor for electrophotography of claim 10, wherein said complex filter is in the form of a layer comprising not less than 70% by weight of said resin.

12. The method for the production of a photoreceptor for electrophotography of claim 11, wherein said complex filter-comprising layer consists of said filter alone.

13. The method for the production of a photoreceptor for electrophotography of claim 10, wherein said complex filter-comprising layer is comprised of said filter and a protective layer.

14. The method for the production of a photoreceptor for electrophotography of claim 13, wherein said complex filter-comprising layer has a thickness of from 10 μm to 100 μm.

15. The method for the production of a photoreceptor for electrophotography of claim 14, wherein said method further comprises treating the photosensitive layer to a filling treatment to smooth the surface thereof by filling any pits or cavities that may be present, thereby to form an anti-penetration layer on said photosensitive layer to prevent penetration of ink, before said printing process.

16. A method for the production of a photoreceptor of claim 9, wherein said complex filter is printed on a transparent thin film arranged on a support with an adhesive layer in between, and said method further comprises a process for peeling said thin film from the support and a process for sticking the peeled thin film having said complex filter on said photosensitive layer.

17. The method for the production of a photoreceptor of claim 16, wherein said adhesive layer is peeled off together with said thin film in said process for peeling said thin film from said support and thereby said thin film is sticked on the upper side of said photoreceptor by means of said adhesive layer.

18. The method for the production of a photoreceptor of claim 16, wherein said adhesive layer is left on said support in said process for peeling said thin film from the support and said peeled thin film having thereon said complex filter is sticked on the upper side of said photoreceptor by means of another adhesion means.

19. The method for the production of a photoreceptor of claim 16, wherein said peeled thin film is sticked beneath said layer.

20. A method for the formation of an image comprising a process for imagewise exposing a high-resistance photoreceptor comprising an electricaly insulating layer subjected to a uniform electric charge and the imagewise exposure thereon, said electrically insulating layer comprising a complex color separation filter layer having plural kinds of color separation filters being juxtaposed in a predetermined arrangement, each of said color separation filters being formed by ink containing a setting transparent resin having a resistivity being not less than $10^8$ ohm-cm and coloring agents being in the amount of 2 to 30% by weight; a photoconductive layer having two opposed sides, said electrically insulating layer being superposed on one side thereof so that said photoconductive layer is imagewise exposed through said insulating layer when said insulating layer is imagewise exposed, and an electrically conductive layer being superposed on the other side of said photoconductive layer and a process for repeating the procedure of uniformly exposing said photoreceptor to a specific light to thereby form a potential pattern on a corresponding section of said filter to said specific light and of developing said pattern with a toner.

21. The method for the formation of an image of claim 14, wherein said repeating process forms an image by superposing the same number of color toner images as that of said filters on said photoreceptor.

22. The method for the formation of an image of claim 15, wherein said complex filter comprises not less than 70% by weight of said resin.

23. The method for the formation of an image of claim 16, wherein said complex filter is formed by a process for making prints into the streak of mosaic form by using a plurality of inks containing said coloring agents and said resin in a medium.

24. A photoreceptor for electophotography which comprises an insulating layer, a filter layer, a photosensitive layer and a conductive member, wherein said filter layer comprises a complex filter comprised of a filter group of filter elements formed by inks containing coloring agents and a setting transparent resin.

25. The photoreceptor of claim 24, wherein said complex filter has a resistivity of not less than $10^9$ Ωcm.

26. The photoreceptor of claim 25, wherein said photoreceptor has not said insulating layer and is formed by sandwiching said photosensitive layer by said filter layer and said conductive member.

27. The photoreceptor of claim 25, wherein said photoreceptor is formed by sandwiching said photosensitive layer by said insulating layer and said conductive member and providing said filter layer beneath said conductive member.

28. The photoreceptor of claim 24, wherein said complex filter is conductive and said photoreceptor has not a conductive member and is formed by sandwiching said photosensitive layer by said insulating layer and said filter layer.

* * * * *